United States Patent [19]

Miwa et al.

[11] Patent Number: 5,686,191
[45] Date of Patent: Nov. 11, 1997

[54] THIN FILM WIRING BOARD

[75] Inventors: Takao Miwa, Katsuta; Masahiro Suzuki, Iwaki; Akio Takahashi, Hitachiota; Yoshiaki Okabe; Yuichi Satsu, both of Hitachi; Shin Nishimura, Katsuta, all of Japan

[73] Assignees: Hitachi, Ltd.; Hitachi Chemical Co., Ltd., both of Tokyo, Japan

[21] Appl. No.: 553,240

[22] Filed: Nov. 7, 1995

Related U.S. Application Data

[63] Continuation of Ser. No. 219,269, Mar. 29, 1994, abandoned.

[30] Foreign Application Priority Data

Apr. 2, 1993 [JP] Japan ................................. 5-098358

[51] Int. Cl.$^6$ ................................................. B32B 27/06
[52] U.S. Cl. ........................ 428/473.5; 428/209; 428/901; 174/110 SR
[58] Field of Search ........................... 525/426, 421, 525/422; 428/209, 473.5, 901; 174/110 SR

[56] References Cited

U.S. PATENT DOCUMENTS 4,826,927  5/1989  Schmid et al. ........................... 525/422

FOREIGN PATENT DOCUMENTS

| 0342912 | 11/1989 | European Pat. Off. . |
| 0523240 | 1/1993 | European Pat. Off. . |
| 90/01522 | 2/1990 | WIPO . |

OTHER PUBLICATIONS

Patent Abstracts of Japan, vol. 15, No. 425.
Patent Abstracts of Japan, vol. 9, No. 32.

*Primary Examiner*—Ana Woodward
*Attorney, Agent, or Firm*—Antonelli, Terry, Stout & Kraus, LLP.

[57] ABSTRACT

A thermosetting resin composition comprising (A) a thermosetting polyimide and (B) a bismaleimide and showing a modulus of elasticity of $10^7$ to $10^2$ dyne/cm$^2$ during heat curing thereof is suitable for forming an adhesive film used in a thin film wiring board having excellent heat resistance and high reliability.

6 Claims, 1 Drawing Sheet

THIN FILM WIRING BOARD

This application is a Continuation application of application Ser. No. 219,269, filed Mar. 29, 1994, now abandoned.

BACKGROUND OF THE INVENTION

This invention relates to a thermosetting resin composition suitable as a material for electrical apparatuses and electronic parts and comprising a polyimide having no thermoplastic property and a thermosetting prepolymer, said composition showing a modulus of elasticity of $10^7$ to $10^2$ dyne/cm$^2$ in the course of heat curing step, and a thin film wiring board using said thermosetting resin composition as an adhesive layer used therein.

Heretofore, there is disclosed a thin film multi-layer wiring board obtained by laminating a plurality of thin film material layers having wiring patterns thereon and a plurality of adhesive films present between thin film material layers (Japanese Patent Unexamined Publication (JP-A) No. 2-45998). Further, JP-A 4-206595 discloses a process for producing a thin film multi-layer wiring board comprising laminating a plurality of thin film material layers having wiring patterns thereon via adhesive films and connecting individual wiring layers by laser drilling and plating.

As an adhesive for wiring boards, there are disclosed thermosetting resin composition obtained by adding bismaleimides to special polyimides (JP-A 59- 179558, 62-11662, etc.). But the polyimides used thereon are thermoplastic polyimides such as Polyimide 2080 (a trade name, mfd. by Mitsubishi Chemical Co., Ltd.). Further, there are also disclosed adhesives obtained by adding thermosetting perpolymers to polyimides having low softening points (JP-A 2-124971 and 2-247,273). The polyimides used therein belong to thermoplastic polyimides according to M. I. Bessonov, et al (M. I. Bessonov, M. M. Koton, V. V. Kudryavtsev and L. A. Laius: "Polyimide" pp 185–199, (1987), published by Plenum Publishing Corp., New York).

Since the adhesive used in the above-mentioned thin film multi-layer wiring boards were brittle, there was a problem in reliability when used in wiring boards practically, resulting in failing to produce thin film wiring boards having reliability. Further, the adhesives used in the production of thin film multi-layer wiring boards had problems in burying property of wiring so as to obtain good.surface flatness and heat resistance, resulting in failing to produce thin film wiring boards having reliability.

The adhesives used in prior art were thermoplastic polyimides having good adhesiveness to adherends and good flowability. But, according to the prior art processes, since the thermoplastic polyimides are low in modulus of elasticity at a glass transition temperature or higher due to softening with heating, there took place troubles such as deformation of adhesive portions and cutting of wirings during a soldering step in the production of large scale integrated circuits (LSI). Further, since the dimensional change rate of thermoplastic polyimides used at a glass transition temperature or higher is large and relative positions between wirings change extremely, there is a great trouble for planning higher density of wiring.

SUMMARY OF THE INVENTION

It is an object of the present invention to provide a thin film wiring board having high reliability by using as an adhesive used therein a special thermosetting resin composition excellent in heat resistance and molding properties and having excellent adhesiveness to resins, ceramics, etc.

It is another object of the present invention to provide a thermosetting resin composition having above-mentioned excellent properties.

The present invention provides a thin film wiring comprising a plurality of base films having wiring patterns thereon and one or more adhesive layers placed between base films, said adhesive layers made from a thermosetting resin composition comprising (A) a polyimide having no thermoplastic property and containing repeating units of the formula:

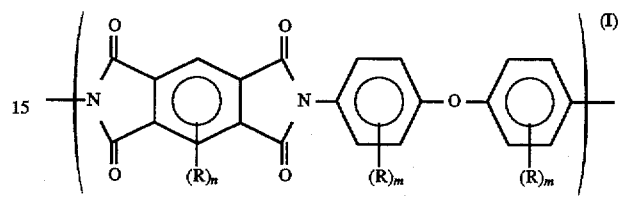

wherein R is an alkyl group, a fluorinated alkyl group, an alkoxy group, a fluorinated alkoxy group, or a halogen atom; n is zero or an integer of 1 or 2; and m is zero or an integer of 1 to 4, in an amount of 30% by weight or more based on the weight of the polyimide, and (B) a bismaleimide compound of the formula:

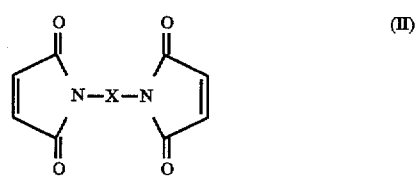

wherein X is a divalent organic group having at least two carbon atoms, and said thermosetting resin composition showing a modulus of elasticity of $10^7$ to $10^2$ dyne/cm$^2$ in the course of heat curing step.

The present invention also provides a thermosetting resin composition comprising (A) a polyimide having no thermoplastic property and containing repeating units of the formula:

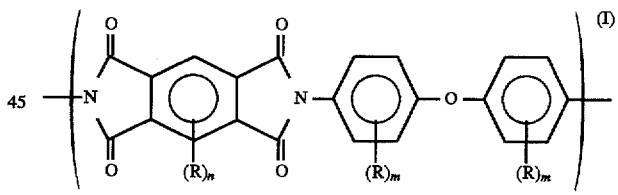

wherein R is an alkyl group, a fluorinated alkyl group, an alkoxy group, a fluorinated alkoxy group, or a halogen atom; n is zero or an integer of 1 or 2; and m is zero or an integer of 1 to 4, in an amount of 30% by weight or more based on the weight of the polyimide, and (B) a bismaleimide compound of the formula:

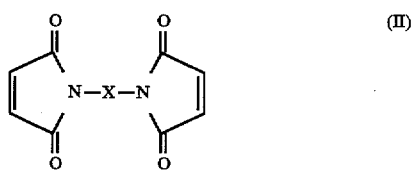

wherein X is a divalent organic group having at least two carbon atoms, and said thermosetting resin composition showing a modulus of elasticity of $10^7$ to $10^2$ dyne/cm$^2$ in the course of heat curing step.

DESCRIPTION OF THE PREFERRED EMBODIMENTS

Figure 1A:
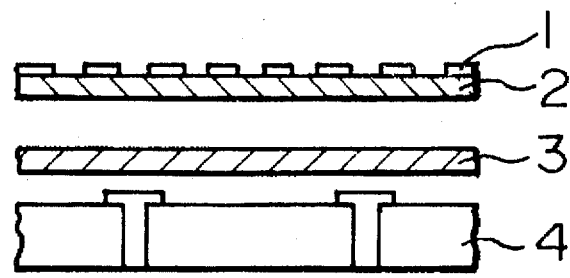
FIGS. 1(A) to 1(D) are cross-sectional views explaining a process for producing a thin film wiring board.
Figure 1B:
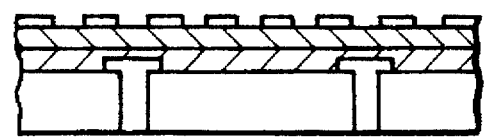
Figure 1C:
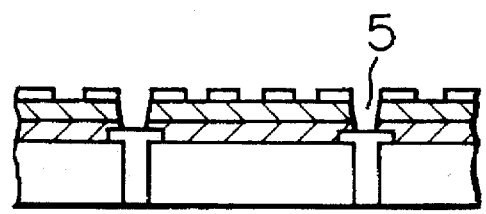
Figure 1D:
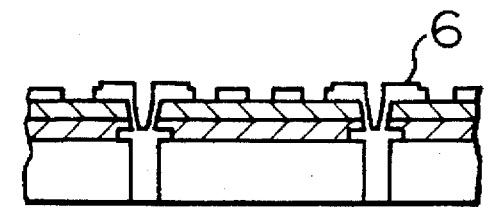

According to the present invention, a thin film wiring board having high reliability can be obtained by using an adhesive layer made from a thermosetting resin composition comprising (A) a polyimide having no thermoplastic property and containing repeating units of the formula:

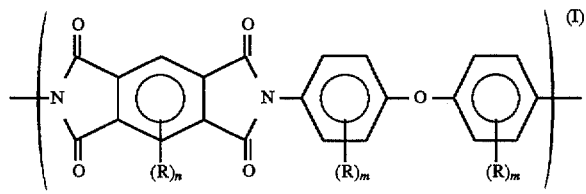

wherein R is an alkyl group preferably having 1 to 6 carbon atom, a fluorinated alkyl group preferably having 1 to 6 carbon atoms, an alkoxy group preferably having 1 to 6 carbon atoms, a fluorinated alkoxy group preferably having 1 to 6 carbon atoms or a halogen atom such as F, Cl, Br or I; n is zero or an integer of 1 or 2; and m is zero or an integer of 1 to 4, in an amount of 30% by weight or more based on the weight of the polyimide, and (B) a bismaleimide compound of the formula:

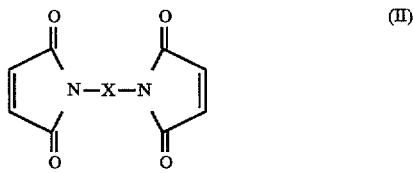

wherein X is a divalent organic group having at least two carbon atoms, for example, an aromatic group such as a phenylene group, an alkyl group, an ether group, a fluorinated alkyl group, or a combination of these groups, said thermosetting resin composition showing a modulus of elasticity of $10^7$ to $10^2$ dyne/cm$^2$ in the course of heat curing step.

When a thermosetting resin is used, it is inevitable to make the resin molten and adhered to an adherend and deformed during curing in order to obtain good adhesiveness and moldability. From the viewpoint of melt flow, it is better to use a thermoplastic polyimide. But when the thermoplastic polyimide is used, the modulus of elasticity of polyimide after curing is undesirably lowered above the glass transition temperature of the polyimide used. In order to solve such a problem, a flow phenomenon of resin during curing was studied earnestly. As a result, it was found that the flow of the resin comprised of a step of a prepolymer melting phenomenon with a temperature rise with heating, and a step of melt flow of polyimide formed by the molten prepolymer.

From the above-mentioned viewpoint, various combinations of prepolymers and polyimides were studied. As a result, it was found surprisingly that, although the polyimide having repeating units of the formula (I) did not have a thermoplastic property when used singly, said polyimide melted well with a molten prepolymer and had a largely lowered modulus of elasticity compared with the case of single use, and a processing window. The term "processing window" means a measure of a resin having a temperature property and a time property from softening of the resin until curing of the resin in the course of curing of thermosetting resin. That is, when a resin has the processing window, it is suitable for adhesives and molding materials.

As the prepolymer, it was found that the bismaleimide of the formula (II) was able particularly well compatible with the above-mentioned polyimide.

The thermosetting composition comprising the polyimide having repeating Units of the formula (I) and the bismaleimide of the formula (II) has the modulus of elasticity of $10^6$ dyne/cm$^2$ or more at 300° C., which value is not expected from the adhesive of JP-A 2-124,971 comprising a thermoplastic polyimide and a bismaleimide. In addition, the thermosetting resin composition of the present invention shows a modulus of elasticity of as largely low as $10^2$ dyne/cm$^2$ to $10^7$ dyne/cm$^2$ in the course of heat curing. This means that adhesiveness to an adherend can be improved greatly.

Further, as the bismaleimide of the formula (II), when a bismaleimide of the formula:

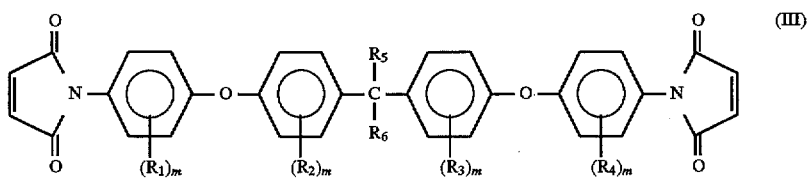

wherein $R_1$ through $R_6$ are independently H, CH$_3$, C$_2$H$_5$, C$_3$H$_7$, F, CF$_3$, C$_2$F$_5$ or C$_3$F$_7$; and m is zero or an integer of 1 to 4, and individual m's may be the same or different, is used in combination with the polyimide having repeating units of the formula (I), better results can be obtained. That is, in the course of curing, the thermosetting resin composition flows in a uniformly molten state and sticks to an adherend to give excellent adhesiveness. Further, after curing, the lowering in modulus of elasticity is small even at high temperatures of 300° C. or higher and mechanical strength is large. By using such a thermosetting resin composition as an adhesive layer, there can be obtained thin film wiring boards having excellent heat resistance, for example, soldering heat resistance of 300° C. or higher.

In the case of using 2,2-bis[4-(4-maleimidophenoxy)phenyl]propane as the maleimide of the formula (III), the curing temperature becomes sufficient at 250° C. or lower, known curing apparatuses and conditions can be used without modification, and the raw materials can be obtained in relatively low cost.

In the case of using 2,2-bis[4-(4-maleimidophenoxy)phenyl]-1,1,1,3,3,3-hexafluoropropane as the maleimide of the formula (III), flow properties during curing and molderbility are particularly excellent, resulting in easily sticking surfaces with fine relief or holes without voids. More concretely, when a pair of wiring sheets having holes of 20 μm in diameter and 50 μm in depth and wirings of 50 μm in width and 50 μm in height thereon are faced each other via a thermosetting resin film mentioned above and pressed, there can be obtained adhered cross-section having no voids.

In the case of using a bismaelimide having 2,2-bis[4-(4-maleimidophenoxy)phenyl]-1,1,1,3,3,3-hexafluoropropane as a skeleton and much more fluorine atoms attached thereto as the maleimide of the formula (III), a dielectric constant of the thermosetting resin composition can be lowered. When such a thermosetting resin composition is used as electronic materials, the transmission rate of signals can be improved.

The polyimide having repeating units of the formula (I) is a reaction product of a tetracarboxylic dianhydride and a diphenyldiamine ether. Examples of the tetracarboxylic dianhydride are pyromellitic dianhydride, 3-methylpyromellitic dianhydride, 3-trifluoromethylpyromellitic dianhydride, etc. Examples of the diphenyldiamino ether are diphenyldiamino ether, 2,2'-dimethyl-4,4'-diaminodiphenyl ether, 2,2'-trifluoromethyl-4,4'-diaminodiphenyl ether, 3,3'-bis(methyl)-4,4'-diaminodiphenyl ether, 3,3'-bis(trifluoromethyl)-4,4'-diaminodiphenyl ether, etc.

The polyimide having repeating units of the formula (I) can be prepared by dehydration condensation with heating of, for example, pyromellitic dianhydride with diphenyldiamino ether in an organic solvent such as diaminoacetamide, dimethylacetamide, dimethylformamide, N-methyl-2-pyrrolidone, etc. according to a conventional process.

As the polyimide (A), it is possible to use other polyimides obtained by reacting an acid component such as a tetracarboxylic dianhydride with an aromatic diamine together with the polyimide having repeating units of the formula (I). As the acid component, there can be used tetracarboxylic acids, esters thereof, acid dianhydrides, and acid chlorides.

Examples of the tetracarboxylic acid compounds are '2,3,3',4'-tetracarboxydiphenyl, 3,3',4,4'-tetracarboxydiphenyl, 3,3',4,4'-tetracarboxydiphenyl ether, 2,3,3',4'-tetracarboxydiphenyl ether, 3,3',4,4'-tetracarboxybenzophenone, 2,3,3',4'-tetracarboxybenzophenone, 2,3,6,7-tetracarboxynaphthalene, 1,4,5,7-tetracarboxynaphthalene, 1,2,5,6-tetracarboxynaphthalene, 3,3',4,4'-tetracarboxydiphenylmethane, 2,2-bis(3,4-dicarboxyphenyl)propane, 3,3',4,4'-tetracarboxydiphenylsullfone, 3,4,9,10-tetracarboxyperylene, 2,2-bis[4-(3,4-dicarboxyphenoxy(phenyl)]propane, 2,2-bis[4-(3,4-dicarboxyphenoxy(phenyl)]hexafluoropropane, butanetetracarboxylic acid, etc. These tetracarboxylic acid compounds can be used singly or as a mixture thereof.

As the aromatic diamines, there can be used p-phenylenediamine, m-phenylenediamine, o-phenylenediamine, 4,4'-diaminodiphenylmethane, 4,4'-diaminophenylsulfide, 4,4,-diaminodiphenylsulfone, 4,4'-diaminodiphenyl ketone, 4,4'-diaminodiphenylpropane, etc.

It is also possible to use as a diamine 4,4'-diaminodiphenyl ether-3-carbonamide of the formula:

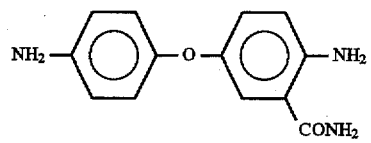

preferably in an amount of 0.01 to 0.2 equivalent weight per equivalent weight of the tetracarboxylic dianhydride. By the use of 4,4'-diaminodiphenyl ether-3-carboxamide, heat resistance of the thermosetting resin composition after cured can be improved without damaging the flowability at the time of curing.

When 4,4'-diaminodiphenyl ether-3-carbonamide is used, a polyimide having repeating units of the formula:

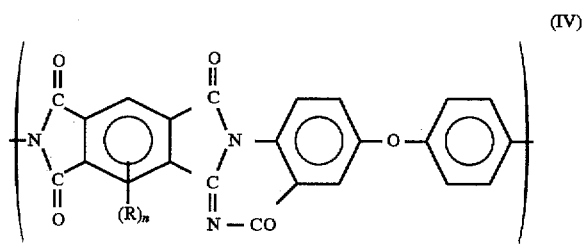

(IV)

wherein R and n are as defined above, is obtained. It is preferable to use the polyimide having the repeating units of the formula (IV) in an amount of 1 to 20% by weight based on the total weight of polyimides, in addition to the polyimide having the repeating units of the formula (I).

Further, it is preferable to use polyimides having the following repeating units (V) and (VI):

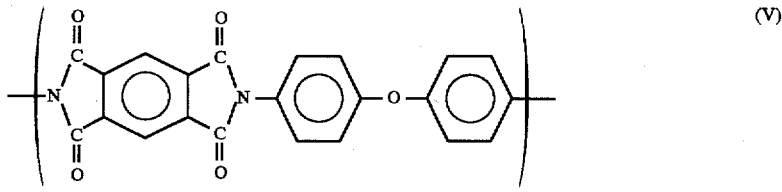

(V)

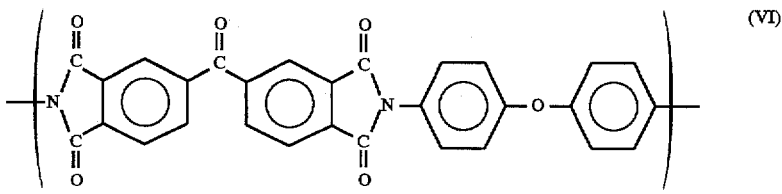

(VI)

In such a case, the use of polyimide having the repeating units of the formula (IV) in an amount of 1–20% by weight based on the total weight of polyimides together with the polyimides having the repeating units of the formulae (V) and (VI) is also preferable.

The polyimide having repeating units of the formula (I) can be used by mixing with other polyimides mentioned above, or at least one of the polyimides can be mixed in the state of polyimide precursor (i.e., poly(amic acid) polymer).

A preferable example of commercially available polyimide precursor is PIQ (a trade name, mfd. by Hitachi Chemical Co., Ltd.). In any cases, the polyimide having repeating units of the formula (I) should be contained in an amount of 30% by weight or more, preferably 50% by weight or more, based on the total weight of the polyimide component (A).

The bismaleimide compound of the formula (II) which can be used as N,N'-substituted unsaturated imides, is addition type bismaleimides including bifunctional maleimides, polyfunctional maleimides and reaction product type maleimides.

Examples of the bifunctional bismaleimides are as follows:
N,N'-ethylenedimaleimide,
N,N'-hexamethylenebismaleimide,
N,N'-dodecamethylenebismaleimide,
N,N'-m-xylylenebismaleimide,
N,N'-p-xylylenedimaleimide,
N,N'-1,3-bismethylenecyclohexanebismaleimide,
N,N'-1,4-bismethylenecyclohexanebismaleimide,
N,N'-2,4-tolylenebismaleimide,
N,N'-2,6-tolylenebismaleimide,
N,N'-3,3-diphenylmethanebismaleimide,
N,N'-4,4-diphenylmethanebismaleimide,
3,3'-diphenylsulfonebismaleimide,
4,4'-diphenylsulfonebismaleimide,
N,N'-4,4'-diphenylsulfidebismaleimide,
N,N'-p-benzophenonebismaleimide,
N,N'-diphenylethanebismaleimide,
N,N'-diphenylether bismaleimide,
N,N'-(methylene-ditetrahydrophenyl)-bismaelimide,
N,N'-(3-ethyl)-4,4'-diphenylmethanebismaleimide,
N,N'-(3,3'-dimethyl)-4,4'-diphenylmethanebismaleimide,
N,N'-(3,3'-diethyl)-4,4'-diphenylmethanebismaleimide,
N,N'-(3,3'-dichloro)-4,4'-diphenylmethanebismaleimide,
N,N'-tolidinebismaleimide,
N,N'-isophoronebismaleimide,
N,N'-p,p'-diphenyldimethylsilylbismaleimide,
N,N'-benzophenonebismaleimide,
N,N'-diphenylpropanebismaleimide,
N,N'-naphthalenebismaleimide,
N,N'-m-phenylenebismaleimide,
N,N'-4,4'-(1,1-diphenyl-cyclohexane)-bismaleimide,
N,N'-3,5-(1,2,4-triazole)-bismaleimide,
N,N'-pyridine-2,6-diylbismaleimide,
N,N'-5-methoxy-1,3-phenylenebismaleimide,
1,2-bis(2-maleimidoethoxy)ethane,
1,3-bis(3-maleimidopropoxy)propane,
bis(3-ethyl-4-maleimido-5-methyl-phenyl)-methane,
N,N'-4,4'-diphenylmethane-bis-dimethylmaleimide,
N,N'-hexamethylene-bis-dimethylmaleimide,
N,N'-4,4'-(diphenyl ether)-bis-dimethylmaleimide,
N,N'-4,4'-(diphenylsulfone)-bis-dimethylmaleimide,
N,N'-bismaleimide of N,N'-4,4'-(diamino) triphenylphosphate, etc.

Examples of polyfunctional maleimides are a reaction product of aniline with formaldehyde (a polyamine compound), a reaction product of 3,4,4'-triaminodiphenylmethane or triaminophenol with maleic anhydride, etc.

Examples of reaction product type maleimides are a reaction product of tris-(4-aminophenyl)-phosphate, tris(4-aminophenyl)-phosphate, or tris(4-aminophenyl)-thiophosphate with maleic anhydride, etc.

Examples of the compounds of the formula (III), which are particularly preferable compounds among those of the formula (II), are as follows.

2,2-bis[4-(4-maleimidophenoxy)phenyl]propane,
2,2-bis[3-methyl-4-(4-maleimidophenoxy)phenyl]propane,
2,2-bis[3-chloro-4-(4-maleimidophenoxy)phenyl]propane,
2,2-bis[3-bromo-4-(4-maleimidophenoxy)phenyl]propane,
2,2-bis[3-ethyl-4-(4-maleimidophenoxy)phenyl]propane,
2,2-bis[3-propyl-4-(4-maleimidophenoxy)phenyl]propane,
2,2-bis[3-isopropyl-4-(4-maleimidophenoxy)phenyl]propane,
2,2-bis[3-butyl-4-(4-maleimidophenoxy)phenyl]propane,
2,2-bis[3-secondary butyl-4-(4-maleimidophenoxy)phenyl]propane,
2,2-bis[3-methoxy-4-(4-maleimidophenoxy)phenyl]propane,
1,1-bis[4-(4-maleimidophenoxy)phenyl]ethane,
1,1-bis[3-methyl-4-(4-maleimidophenoxy)phenyl]ethane,
1,1-bis[3-chloro-4-(4-maleimidophenoxy)phenyl]ethane,
1,1-bis[3-bromo-4-(4-maleimidophenoxy)-phenyl]ethane,
bis[4-(4-maleimidophenoxy)phenyl]methane,
bis[3-methyl-4-(4-maleimidophenoxy)phenyl]methane,
bis[3-chloro-4-(4-maleimidophenoxy)phenyl]methane,
bis[3-bromo-4-(4-maleimidophenoxy)phenyl]methane,
1,1,1,3,3,3-hexachloro-2,2-bis[4-(4-maleimidophenoxy)phenyl]propane,
3,3-bis[4-(4-maleimidophenoxy)phenyl]pentane,
1,1-bis[4-(4-maleimidophenoxy)phenyl]propane,
2,2-bis[3,5-dimethyl-4-(4-maleimidophenoxy)phenyl]propane,
2,2-bis[3-fluro-4-(4-maleimidophenoxy)phenyl]propane,
2,2-bis[3-trifluoromethyl-4-(4-maleimidophenoxy)phenyl]propane,
2,2-bis[3-perfluoropropyl-4-(4-maleimidophenoxy)phenyl]propane,
2,2-bis[4-(3-methyl-4-maleimidophenoxy)phenyl]propane,
2,2-bis[3-methyl-4-(3,5-dimethyl-4-maleimidophenoxy)phenyl]propane,
2,2-bis[3-propyl-4-(3-fluoro-4-maleimidophenoxy)phenyl]propane,
2,2-bis[3,5-dimethyl-4-(3-trifluoromethyl-4-maleimidophenoxy)phenyl]propane,
2,2-bis[3-fluoro-4-(3-perfluoropropane-4-maleimidophenoxy)phenyl]propane,
2,2-bis[3-trifluoromethyl-4-(3-trifluoro-methyl-4-maleimidophenoxy)phenyl]propane, etc.

Examples of bismaleimides having 2,2-bis[4-(4-maleimidophenoxy)phenyl]-1,1,1,3,3,3-hexafluoropropane skeleton among bismaleimides of the formula (III) are as follows.

1,1,1,3,3,3-hexafluoro-2,2-bis[4-(4-maleimidophenoxy)phenyl]propane,
1,1,1,3,3,3-hexafluoro-2,2-bis[3,5-dimethyl-4-(4-maleimidophenoxy)phenyl]propane,
1,1,1,3,3,3-hexafluoro-2,2-bis[3,5-dibromo-4-(4-maleimidophenoxy)phenyl]propane,
1,1,1,3,3,3-hexafluoro-2,2-bis[3-methyl-4-(4-maleimidophenoxy)phenyl]propane,
1,1,1,3,3,3-hexafluoro-2,2-bis[3-propyl-4-(4-maleimidophenoxy)phenyl]propane,
1,1,1,3,3,3-hexafluoro-2,2-bis[3-fluoro-4-(4-maleimidophenoxy)phenyl]propane,
1,1,1,3,3,3-hexafluoro-2,2-bis[3-pefluoro-propyl-4-(4-maleimidophenoxy)phenyl]propane, 1,1,1-3,3,3-hexafluoro-2,2-bis[3-trifluoro-methyl-4-(4-maleimidophenoxy)phenyl]propane, 1,1,1,3,3,3-hexafluoro-2,2-bis[3,5-ditrifluoromethyl-4-(4-maleimidophenoxy)phenyl]propane, 1,1,1,3,3,3-hexafluoro-2,2-bis[4-(3-methyl-4-maleimidophenoxy)phenyl]propane, 1,1,1,3,3,3-hexafluoro-2,2-bis[3-methyl-4-(3,5-dimethyl-4-maleimidophenoxy)phenyl]propane, 1,1,1,3,3,3-hexafluoro-2,2-bis[3-propyl-4-(3-fluoro-4-maleimidophenoxy)phenyl]propane, 1,1,1,3,3,3-hexafluoro-2,2-bis[3-fluoro-4-(3-perfluoropropyl-4-maleimidophenoxy)phenyl]propane, 1,1,1,3,3,3-hexafluoro-2,2-bis[3,5-ditri-fluoromethyl-4-(3,5-ditrifluoromethyl-4-maleimidophenoxy)phenyl]propane, etc.

The thermosetting resin composition of the present invention comprises (A) a polyimide having no thermoplastic property and containing repeating units of the formula (I) in an amount of 30% by weight or more based on the total weight of the polyimide component, and (B) a bismaleimide compound of the formula (II).

The polyimide (A) having no thermoplastic property means that the polyimide is thermosetting, has a modulus of elasticity of preferably $10^5$ dyne/cm$^2$ or more at 300° C., and is hardly soluble in an organic solvent.

The thermosetting resin composition can be prepared by (i) preparing a varnish of poly(amic acid) which is a precursor of the polyimide having repeating units of the formula (I), mixing with a bismaleimide of the formula (II), and carrying out imidization with heating, (ii) mixing the polyimide with the bismaleimide in powder state, preferably under a molten state of bismaleimide, or the like convention method.

The thermosetting resin composition may further contain one or more other polymers and fillers so long as the desired properties are not reduced. For example, it is possible to contain one or more thermosetting prepolymers in addition to 2,2-bis[4-(4-maleimideophenoxy)phenyl]propane, or 2,2-bis[4-(4-maleimidophenoxy)phenyl]-1,1,1,3,3,3-hexafluoropropane, so long as the desired properties are not reduced. If necessary, a radial generator can be mixed so as to lower the curing temperature.

The mixing ratio of the polyimide (A) and the bismaleimide (B) in the thermosetting resin composition is preferably 100 parts by weight of the polyimide (A) and 50 to 200 parts by weight of the bismaelimide (B). When the amount of the bismaleimide (B) is lower than 50 parts by weight, uniform melting of (A) and (B) during curing becomes difficult, resulting in lowering adhesiveness and moldability. On the other hand, when the amount of the bismaleimide (B) is more than 200 parts by weight, heat resistance and mechanical strength of cured product are undesirably lowered. Further, when the proportion of the polyimide having repeating units of the formula (I) becomes lower than 30% by weight based on the total weight of polyimide component, the adhesiveness and modulus of elasticity at high temperatures are undesirably lowered.

By using the thermosetting resin composition in the adhesive layer in the thin film wiring board, the resulting thin film wiring board shows excellent heat resistance.

Further, since the thermosetting resin composition shows a modulus of elasticity of $10^2$ to $10^7$ dyne/cm$^2$ in the course of heat curing step, there can be obtained excellent adhesive strength between the resin and conductor such as copper as high as 0.5 kg/cm to 2.0 kg/cm and good burying property of wiring in the resin (adhesive) layer so as to obtain good surface flatness without causing level difference.

The thin film wiring board of the present invention can be produced, without influences of the use of the thermosetting resin composition, by a conventional method for producing conductors such as etching, electroless plating, electric plating, evaporation, sputtering, etc.

The thin film wiring board is effectively used as a package for logic element and module substrate, etc. in large-scale computers, super computers, work stations, etc.

The present invention is illustrated by way of the following Examples, in which all percents are by weight unless otherwise specified.

EXAMPLE 1

In a 2000-ml three-necked flask equipped with a stirrer, 143.6 g of 4,4'-diaminodiphenyl ether (DDE) and 700 ml of N-methyl-2-pyrrolidone (NMP) were placed and dissolved. Then, 156.4 g of pyromellitic dianhydride was gradually added to the flask to carry out the reaction with stirring at −5° C. to room temperature for 6 hours to give a varnish of poly(amic acid) (1) (solid content: 30%, reduced viscosity: 0.95 dl/g at 25° C. in N-methylpyrrolidone).

Then, an NMP solution containing 113.1 g of 2,2-bis[4-(4-maleimidophenoxy)phenyl]-1,1,1,3,3,3-hexafluoropropane (6FDAPP-BMI) was added to the poly (amic acid) varnish (1) and mixed and dissolved at room temperature to give a varnish (1-a) (solid content: 30%). The proportion of 6FDAPP-BMI (solid content) in the total solid was made 40%.

The varnish (1-a) was coated on a polyimide film (Upilex R film, a trade name, mfd. by Ube Industries, Ltd.) of 0.1 mm thick and heated in a constant temperature bath (conditions: 100° C./60 min+200° C./30 min) to give an imide film (1-b).

The imide film (1-b) was pealed off from the Upilex R film and subjected to a heat press treatment (conditions: 270° C./50 min, pressure 30 kgf/mm$^2$) using a press to give an imide film (1-c).

The imide films (1-b) and (1-c) were subjected to measurement of modulus of elasticity using a viscoelasticity tester (DVE-V4 type, mfd. by Rheology Co., Ltd.) under the following conditions:

| | |
|---|---|
| Length of specimen: | 30 mm |
| Chuck distance: | 20 mm |
| Sinusoidal strain displacement under continuous vibration: Automatic static loading | 0.0005 mm |
| Frequency: | 5 Hz |
| Temperature rise: | 2° C./min |

Further, using a tensile tester, breaking strain and breaking strength were measured under the following conditions:

| | |
|---|---|
| Length of specimen: | 60 mm |
| Chuck distance: | 40 mm |
| Tensile speed: | 5 mm/min |
| Room temperature | |

Further, peal strength was measured at a copper foil surface and polyimide surface.

The results are shown in Table 1.

EXAMPLES 2 to 4

Films (1-b) and (1-c) were produced in the same manner as described in Example 1, except for changing the proportion of 6FDAPP-BMI (solid content) in the varnish (1-a) (total solid content) to 30%, 50% and 65%.

Properties of the films were evaluated in the same manner as described in Example 1 and listed in Table 1.

EXAMPLE 5

A polyimide obtained from 3,3',4,4'-benzophenonetetracarboxylic dianhydride and 2,2-bis[4-(para-aminophenoxy)phenyl]propane in the same manner as described in Example 1 was used in place of 30% of the polyimide of Example 2.

Properties of the resulting films were evaluated in the same manner as described in Example 1 and listed in Table 1.

EXAMPLE 6

A polyimide obtained from 3,3',4,4'-biphenyltetracarboxylic dianhyride and diaminodiphenyl ether in the same manner as described in Example 1 was used in place of 50% of the polyimide of Example 2.

Properties of the resulting films were evaluated in the same manner as described in Example 1 and listed in Table 1.

EXAMPLE 7

The process of Example 1 was repeated except for using 2,2-bis[4-(4-maleimidophenoxy)phenyl]propane in place of 50% of 2,2-bis[4-(4-maleimidophenoxy)phenyl]-1,1,1,3,3,3-hexafluoropropane.

properties of the resulting films were evaluated in the same manner as described in Example 1 and listed in Table 1.

EXAMPLE 8

The process of Example 1 was repeated except for using 2,2-bis[4-(4-maleimidophenoxy)phenyl]propane in place of 2,2-bis[4-(4-maleimidophenoxy)phenyl]-1,1,1,3,3,3-hexafluoropropane.

Properties of the resultings films were evaluated in the same manner as described in Example 1 and listed in Table 1.

EXAMPLE 9

The process of Example 1 was repeated except for using a polyimide obtained from 3,3',4,4'-benzophenonetetracarboxylic dianhydride and diaminodiphenyl ether in place of 50% of the polyimide used in Example 1.

Properties of the resulting films were evaluated in the same manner as described in Example 1 and listed in Table 1.

EXAMPLE 10

The process of Example 1 was repeated except for using a polyimide obtained from 3,3',4,4'-benzophenonetetracarboxylic dianhydride and diaminodiphenyl ether in place of 50% of the polyimide used in Example 1, and using 6FDAPP-BMI of Example 2.

Properties of the resulting films were evaluated in the same manner as described in Example 1 and listed in Table 1.

EXAMPLE 11

The process of Example 1 was repeated except for using a polyimide obtained from 3,3',4,4'-benzophenonetetracarboxylic dianhydride and diaminodiphenyl ether in place of 50% of the polyimide used in Example 1, and using 6FDAPP-BMI of Example 3.

Properties of the resulting films were evaluated in the same manner as described in Example 1 and listed in Table 1.

EXAMPLE 12

The process of Example 1 was repeated except for using a polyimide obtained from 3,3',4,4'-benzophenonetetracarboxylic dianhydride and diaminodiphenyl ether in place of 50% of the polyimide used in Example 1, and using 6FDAPP-BMI of Example 4.

Properties of the resulting films were evaluated in the same manner as described in Example 1 and listed in Table 1.

EXAMPLE 13

The process of Example 1 was repeated except for using bis(3-ethyl-4-maleimido-5-methylphenyl)methane in place of 6FDAPP-BMI.

Properties of the resulting films were evaluated in the same manner as described in Example 1 and listed in Table 1.

EXAMPLE 14

The process of Example 9 was repeated except for using bis(3-ethyl-4-maleimido-5-methylphenyl)methane in place of 6FDAPP-BMI.

Properties of the resulting films were evaluated in the same manner as described in Example 1 and listed in Table 1.

Comparative Example 1

After dissolving 2,2-bis[4-(4-diaminophenoxy)phenyl] propane in N-methyl-2-pyrrolidone, an equal amount of 3,3,,4,4'-benzophenonetetracarboxylic dianhydride was added thereto so as to make the total solid content 30%. After polymerizing at room temperature with stirring, a varnish of poly(amic acid) was obtained (reduced viscosity 0.82 dl/g at 25° C. in N-methylpyrrolidone). Then, bis(4-maleimidophenyl)methane was added to the poly(amic acid) varnish so as to make the total solid content 30%.

Properties of the resulting films were evaluated in the same manner as described in Example 1 and listed in Table 1.

Comparative Example 2

The process of Example 1 was repeated except for using a polyimide (reduced viscosity 1.05 dl/g at 25° C. in N-methylpyrrolidone) obtained from 3,3',4,4'-biphenylcarboxylic dianhydride and para-phenylenediamine in place of the polyimide of Example 1.

Properties of the resulting films were evaluated in the same manner as described in Example 1 and listed in Table 1.

Comparative Example 3

After dissolving 3,3',4,4'-benzophenonetetracarboxylic dianhydride in N-methyl-2-pyrrolidone, tolylene diisocyanate and 4,4'-diphenylmethane diisocyanate (61:37.5 in weight ratio) were added so as to make the ratio of acid anhydride to isocyanate in equal amounts and to make the total solid content 30%. The resulting solution was heated at 40° C. for 2.5 hours with stirring, and gradually heated to 90° C., and reacted at 90° C. for 2 hours, followed by heating at 130° C. for 20 hours with stirring to give a polyimide solution (reduced viscosity 1.13 dl/g at 25° C. in N-methylpyrrolidone). The resulting solution was cooled to 60° C., followed by addition of N,N'-(methylene-p-phenylene)dimaleimide in the same amount as the 4,4'-diphenylmethane diisocyanate to give a uniform resin solution.

Films were formed from the resin solution and properties of the films were evaluated in the same manner as described in Example 1 and listed in Table 1.

TABLE 1

| | Modulus of elasticity (dyne/cm$^2$) | | Mechanical properties | | Peal strength (kg/cm) | |
|---|---|---|---|---|---|---|
| | Before curing (250° C.) | After curing (300° C.) | Breaking strain (%) | Breaking strength (Kg/mm$^2$) | Copper foil surface | Polyimide surface |
| Example 1 | Less than 10$^6$ | 3.0 × 10$^9$ | 12.5 | 14.5 | 1.0 | 0.8 |
| Example 2 | Less than 10$^6$ | 4.0 × 10$^9$ | 11.0 | 12.3 | 0.9 | 0.8 |
| Example 3 | Less than 10$^6$ | 2.5 × 10$^9$ | 10.5 | 13.0 | 1.2 | 1.1 |
| Example 4 | Less than 10$^6$ | 1.5 × 10$^9$ | 9.5 | 12.5 | 1.5 | 1.3 |
| Example 5 | Less than 10$^6$ | 2.0 × 10$^9$ | 10.0 | 15.2 | 1.2 | 1.1 |
| Example 6 | Less than 10$^6$ | 3.2 × 10$^9$ | 12.2 | 11.5 | 1.2 | 1.2 |
| Example 7 | Less than 10$^6$ | 4.3 × 10$^9$ | 10.2 | 10.8 | 1.1 | 1.0 |
| Example 8 | Less than 10$^6$ | 4.2 × 10$^9$ | 7.5 | 10.5 | 1.0 | 1.3 |
| Example 9 | Less than 10$^6$ | 2.0 × 10$^9$ | 13.7 | 14.0 | 1.2 | 1.0 |
| Example 10 | Less than 10$^6$ | 3.3 × 10$^9$ | 12.5 | 13.0 | 1.1 | 0.9 |
| Example 11 | Less than 10$^6$ | 1.8 × 10$^9$ | 12.0 | 13.4 | 1.3 | 1.2 |
| Example 12 | Less than 10$^6$ | 1.2 × 10$^9$ | 10.4 | 13.2 | 1.5 | 1.3 |
| Example 13 | Less than 10$^6$ | 4.0 × 10$^9$ | 7.3 | 13.5 | 1.0 | 0.7 |
| Example 14 | Less than 10$^6$ | 3.5 × 10$^9$ | 8.7 | 12.9 | 1.1 | 0.8 |
| Comparative Example 1 | Less than 10$^6$ | 4.0 × 10$^8$ | 2.7 | 6.8 | 0.2 | 0.85 |
| Comparative Example 2 | Unmeasurable | 5.5 × 10$^9$ | 2.9 | 7.9 | 0 | 0 |
| Comparative Example 3 | Less than 10$^6$ | 5.0 × 10$^8$ | 2.4 | 5.0 | 0.4 | 0.5 |

In Table 1, the modulus of elasticity was measured before curing at 250° C. and after curing at 300° C. As is clear from Table 1, the heat resistant adhesive films according to the present invention show lower modulus of elasticity before curing (at 250° C.) but after cured, show higher modulus of elasticity (at 300°) with high values of breaking strain and breaking strength. Further, the heat resistant adhesive films according to the present invention are also excellent in adhesiveness to copper and other polyimide.

EXAMPLE 15

Figure 2:
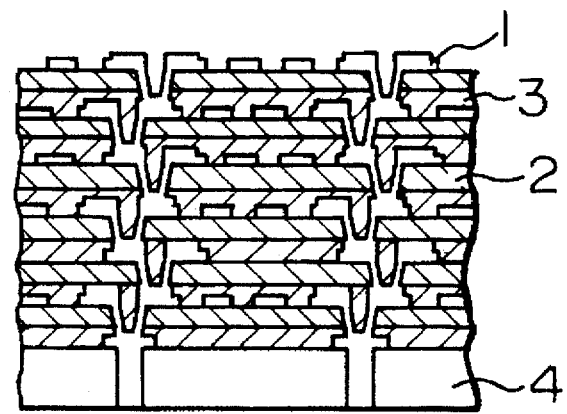
FIG. 2 is a cross-sectional view of a thin film multi-layered wiring board.

A process for producing a thin film wiring board is explained referring to FIGS. 1 and 2.

A one side copper-clad polyimide film (2) (MCF 5000I, a trade name, mfd. by Hitachi Chemical Co., Ltd. thickness of copper 18 μm, thickness of polyimide 25 μm) was subjected to patterning by lithography to form a wiring pattern (1). The polyimide film (2) having a pattern thereon was subjected to a plasma treatment and laminated on a mullite substrate (4) via an adhesive film (3) obtained in Example 1 (thickness 25 μm) using a mask aligner for fitting the position, followed by pressing with heating at 280° C. for 60 minutes in an autoclave (FIG. 1(B)). Then, bear holes (5) were formed at predetermined positions using an excimer laser (FIG. 1(C)). Then, metallic copper (6) was deposited by electroless plating after a lithographic step to connect the wiring (1) on the polyimie film (FIG. 1(D)). The above-mentioned process was repeated to form a thin film 6-layered wiring board (FIG. 2).

The resulting thin film wiring board was dipped in a solder bath heated at 330° C. for 10 minutes (the heat resistance test), but no change was found.

EXAMPLE 16

The process of Example 15 was repeated except for using the adhesive film obtained in Example 5 (25 μm thick) in place of that of Example 1.

The resulting thin film wiring board showed no change in the same heat resistance test as in Example 15.

EXAMPLE 17

The process of Example 15 was repeated except for using the adhesive film obtained in Example 7 (25 μm thick) in place of that of Example 1.

The resulting thin film wiring board showed no change in the same heat resistance test as in Example 15.

EXAMPLE 18

The process of Example 15 was repeated except for using the adhesive film obtained in Example 9 (25 μm thick) in place of that of Example 1.

The resulting thin film wiring board showed no change in the same heat resistance test as in Example 15.

EXAMPLE 19

The process of Example 15 was repeated except for using the adhesive film obtained in Example 10 (25 μm thick) in place of that of Example 1.

The resulting thin film wiring board showed no change in the same heat resistance test as in Example 15.

EXAMPLE 20

The process of Example 15 was repeated except for using the adhesive film obtained in Example 13 (25 μm thick) in place of that of Example 1.

The resulting thin film wiring board showed no change in the same heat resistance test as in Example 15.

EXAMPLE 21

The process of Example 15 was repeated except for using the adhesive film obtained in Example 14 (25 μm thick) in place of that of Example 1.

The resulting thin film wiring board showed no change in the same heat resistance test as in Example 15.

EXAMPLE 22

On a polyimide film of 25 μm thick, underlying copper of 1000 Å thick was formed by evaporation, followed by coating of a photo resist thereon. After exposure to light and development on the predetermined portions, copper was deposited (20 μm thick) on the predetermined portions on the wiring by electric plating to obtain a stud for electrically connecting to upper layer wirings. Further, the underlying copper was removed by etching to give a wiring pattern. On the resulting wiring pattern, the adhesive film (40 μm thick) obtained in Example 2 was placed and pressed with heating under the same conditions as in Example 15 to obtain a stud burying the wiring therein. The surface of the adhesive film was polished to expose the stud portion to give a first layer wiring film.

The process mentioned above was repeated to give a three-layered thin film wiring board.

The resulting thin film wiring board was subjected to the heat resistance test by dipping in a solder bath at 330° C. for 10 minutes. No change was found.

Comparative Example 4

The process of Example 15 was repeated except for using the adhesive film obtained in Comparative Example 1 (25 μm thick) in place of that of Example 1.

When the resulting thin film wiring board was subjected to the heat resistance test by dipping it in a solder bath at 330° C., blisters were formed within 10 seconds.

Comparative Example 5

The process of Example 15 was repeated except for using the adhesive film obtained in Comparative Example 3 (25 μm thick) in place of that of Example 1.

When the resulting thin film wiring board was subjected to the heat resistance test by dipping it in a solder bath at 330° C., blisters were formed within 10 seconds.

As mentioned above, the thin film wiring board of the present invention is excellent in heat resistance at high temperatures, and thus can be directly mounted on LSIs and chip carriers. Further, the thermosetting resin composition of the present invention can be used as insulating materials for electronic parts, and the like.

What is claimed is:

1. A thin film wiring board comprising a plurality of base films having the wiring patterns thereon and one or more adhesive layers placed between base films, said adhesive layers being made from a thermosetting resin composition consisting essentially of (A) a polyimide, that is thermosetting and has a modulus of elasticity of $10^5$ dyne/cm$^2$ or more at 300° C. and containing repeating units of the formula:

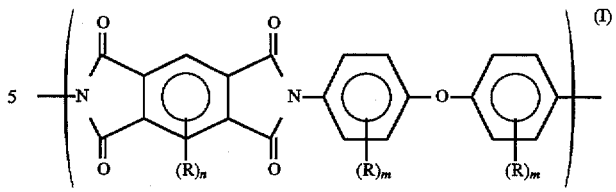

wherein R is an alkyl group, a fluorinated alkyl group, an alkoxy group, a fluorinated alkoxy group, or a halogen atom; n is zero or an integer of 1 or 2; and m is zero or an integer of 1 to 4, in an amount of 30% by weight or more based on the total weight of the polyimide component, and (B) a bismaleimide compound of the formula:

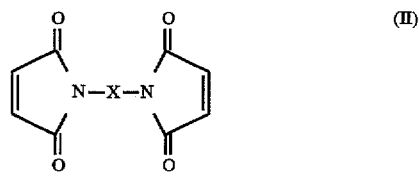

wherein X is a divalent organic group having at least two carbon atoms, and said thermosetting resin composition showing a modulus of elasticity of $10^7$ dyne/cm$^2$ to $10^2$ dyne/cm$^2$ during heat curing thereof.

2. The thin film wiring board according to claim 1, wherein the bismaleimide compound is represented by the formula:

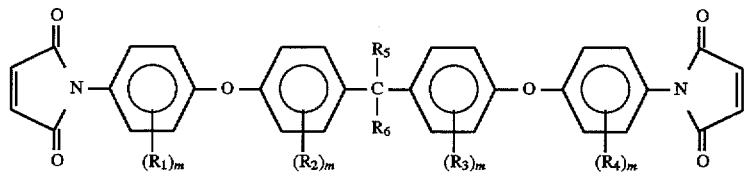

wherein each $R_1$ through $R_6$ is independently H, $CH_3$, $C_2H_5$, $C_3H_7$, F, $CF_3$, $C_2F_5$ or $C_3F_7$; and m is 4.

3. The thin film wiring board according to claim 1, wherein the components (A) and (B) are mixed in amounts of 100 parts by weight of the component (A) and 50 to 200 parts by weight of the component (B).

4. The thin film wiring board according to claim 1, wherein the component (A) is prepared by reacting pyromellitic dianhydride with diphenyldiamino ether in an organic solvent.

5. The thin film wiring board according to claim 1, wherein the polyimide has repeating units of both of the formulae:

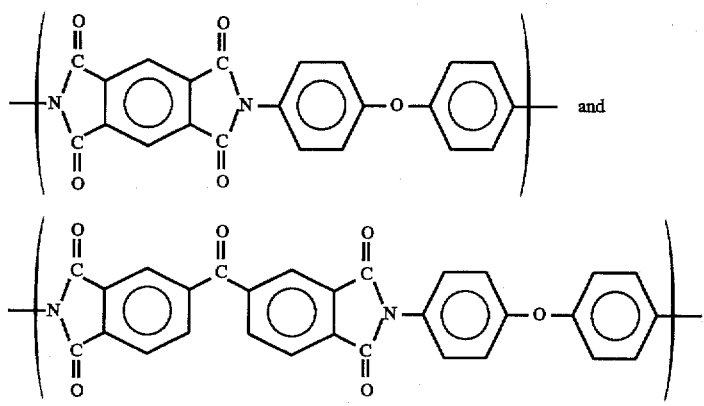
6. The thin film wiring board according to claim 1, wherein the polyimide is obtained from a poly(amic acid) by imidization.
* * * * *